(12) United States Patent
Shinmori

(10) Patent No.: US 9,692,206 B2
(45) Date of Patent: Jun. 27, 2017

(54) EXTERNAL RESONATOR TYPE LASER DEVICE

(71) Applicant: Ushio Denki Kabushiki Kaisha, Tokyo (JP)

(72) Inventor: Tatsunori Shinmori, Tokyo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/265,082

(22) Filed: Sep. 14, 2016

(65) Prior Publication Data

US 2017/0077676 A1    Mar. 16, 2017

(30) Foreign Application Priority Data

Sep. 16, 2015   (JP) ................................. 2015-182748

(51) Int. Cl.
| | |
|---|---|
| H01S 5/00 | (2006.01) |
| H01S 5/14 | (2006.01) |
| H01S 5/022 | (2006.01) |
| H01S 5/026 | (2006.01) |

(52) U.S. Cl.
CPC ............ H01S 5/141 (2013.01); H01S 5/0226 (2013.01); H01S 5/02236 (2013.01); H01S 5/14 (2013.01); *H01S 5/0261* (2013.01)

(58) Field of Classification Search
CPC ........ H01S 5/141; H01S 5/02236; H01S 5/14; H01S 5/0226; H01S 5/0261
See application file for complete search history.

(56) References Cited

U.S. PATENT DOCUMENTS

| 9,356,420 B1* | 5/2016 | Cook ...................... H01S 3/07 |
| 2005/0002433 A1* | 1/2005 | Mooradian ......... H01S 5/18311 |
| | | 372/97 |
| 2007/0002926 A1 | 1/2007 | McDonald et al. |

(Continued)

FOREIGN PATENT DOCUMENTS

| JP | H05-316282 A | 11/1993 |
| JP | 2001-326292 A | 11/2001 |

(Continued)

OTHER PUBLICATIONS

An Office Action; "Notification of Reasons for Refusal" issued by the Japanese Patent Office on Feb. 14, 2017, which corresponds to Japanese Patent Application No. 2015-182748 and is related to U.S. Appl. No. 15/265,082; with English language translation.

*Primary Examiner* — Kinam Park

(74) *Attorney, Agent, or Firm* — Studebaker & Brackett PC

(57) ABSTRACT

An external resonator type laser device has an optical element that forms an external resonator with a semiconductor device by selecting and reflecting light of a specific wavelength range from light outputted from the semiconductor device; a supporting member formed of a material having a larger coefficient of linear expansion than the optical element; and a first mount interposed between the optical element and the supporting member, formed of a material having a coefficient of linear expansion closer to that of the optical element compared with that of the supporting member. The optical element is adhered to the first mount. The first mount is adhered to the supporting member by an adhesive having a Shore hardness of less than or equal to 65.

4 Claims, 14 Drawing Sheets

(56) References Cited

U.S. PATENT DOCUMENTS

| | | | |
|---|---|---|---|
| 2008/0165327 A1 | 7/2008 | Takagi | |
| 2008/0298402 A1* | 12/2008 | Rossi | H01S 5/02248 372/20 |
| 2009/0213881 A1* | 8/2009 | Steegmuller | H01S 5/02248 372/22 |
| 2012/0105943 A1* | 5/2012 | Hatanaka | H01S 5/141 359/326 |

FOREIGN PATENT DOCUMENTS

| | | |
|---|---|---|
| JP | 2003-526930 A | 9/2003 |
| JP | 2008-288616 A | 11/2008 |
| JP | 2009-065072 A | 3/2009 |
| JP | 2012-098495 A | 5/2012 |
| JP | 2013-258282 A | 12/2013 |
| JP | 2014-187138 A | 10/2014 |
| WO | 01/67563 A2 | 9/2001 |

\* cited by examiner

Fig. 4

| Adhesive | Shore hardness | Occurrence / nonoccurrence of crack |
|---|---|---|
| A | 50 | Not observed |
| B | 55 | Not observed |
| C | 60 | Not observed |
| D | 65 | Not observed |
| E | 70 | Observed |
| F | 75 | Observed |
| G | 80 | Observed |
| H | 85 | Observed |
| I | 90 | Observed |

EXTERNAL RESONATOR TYPE LASER DEVICE

BACKGROUND OF THE INVENTION

Field of the Invention

The present invention relates to an external resonator type laser device.

Description of the Related Art

Conventionally, a wavelength conversion type laser in which a surface emitting type semiconductor device is provided with an external resonator, and a wavelength conversion element formed of nonlinear optical crystals is interposed between the semiconductor device and the external resonator is known. A technique of using a wavelength selectable reflecting mirror as the external resonator, and optical crystals of polarity-inverted lithium niobate (PPLN: Periodically Poled Lithium Niobate) or the like as the wavelength conversion element is known (see Patent document 1 below). Also a technique of using a volume bragg grating (VBG) in place of the reflecting mirror used in an external resonator is known (see Patent document 2 below). Also a technique of using a TFF (dielectric thin film filter) and an optical member in place of the volume bragg grating (VBG) is known (see Patent document 3 below).

Referring to FIG. 9, a conventional external resonator type laser device (hereinafter, appropriately abbreviated as a "laser device 90") will be described. FIG. 9 is a view schematically showing a configuration of a conventional external resonator type laser device disclosed in Patent document 2.

The conventional laser device 90 includes a semiconductor device 3 having a light emitting part 2, a volume bragg grating (VBG) 5 as a wavelength selection element, periodically poled lithium niobate (PPLN) 7 as a wavelength conversion element, and reflection members 9, 11.

As shown in FIG. 9, the light emitting part 2 is disposed on the semiconductor device 3. Basic light is radiated from the light emitting part 2. The semiconductor device 3 is brought into abutment on a heat sink 15 for radiating the heat generated from the light emitting part 2.

The basic light radiated from the light emitting part 2 is light having a predetermined wavelength distribution. The VBG 5 is provided for selecting a specific wavelength range from the basic light. The PPLN 7 has a function of outputting light after conducting wavelength conversion on part of the light in a specific wavelength range, of the incident light.

The light emitting part 2 installed on the semiconductor device 3 radiates basic light. The basic light is not light that has only components of a specific wavelength range, but light having a predetermined wavelength distribution. As the basic light passes the VBG 5, only the light in a specific wavelength range is selectively reflected. Hereinafter, the light selected by the VBG 5 as the wavelength selection element is called "first light". The VBG 5 has a function of transmitting light in a wavelength range of later-described second light.

The first light reflected from the VBG 5 passes inside the PPLN 7. The PPLN 7 is configured to output light after conducting wavelength conversion on part of the light in a specific wavelength range as described above. Here, the PPLN 7 converts part of wavelengths of the light of the wavelength components possessed by the first light, and generates light having a different wavelength. Hereinafter, the light converted by the PPLN 7, and having a wavelength after conversion is called "second light".

Even when the wavelength range of the first light is in a wavelength range that can be wavelength-converted by the PPLN 7, the entire incident first light is not converted into the second light at once, but part of the first light passes the PPLN 7 without being converted. Therefore, from the PPLN 7, the second light generated by the PPLN 7, and the first light that is not wavelength-converted in the PPLN 7 are outputted toward the semiconductor device 3.

Between the PPLN 7 and the semiconductor device 3, the reflection members 9 and 11 are disposed. These reflection members 9 and 11 are configured to reflect the light of the wavelength range possessed by the second light, and transmit at least the light of the wavelength range possessed by the first light. Therefore, the second light outputted from the PPLN 7 toward the semiconductor device 3 is reflected by the reflection members 9 and 11 and the direction of the light is changed, and then outputted outside the device 90 (second light 40).

On the other hand, the first light that is not wavelength-converted by the PPLN 7 and has permeated the PPLN 7 as it is permeates the reflection member 9 and enters the semiconductor device 3. The semiconductor device 3 is provided with a reflection member (internal mirror) (not shown), and the incident first light is reflected toward the direction of the PPLN 7.

The first light that is incident from the side of the semiconductor device 3 is partly wavelength-converted while it passes inside the PPLN 7 to become second light in the same manner as described above. The second light reaches the VBG 5. As described above, since the VBG 5 is configured to transmit the light of the wavelength range possessed by the second light, the incident second light permeates as it is and is then outputted outside the laser device 90 (second light 50). On the other hand, the first light that is not wavelength-converted is reflected again by the VBG 5 and travels toward the PPLN 7.

That is, in the laser device 90, an external resonator is formed between the internal mirror formed inside the semiconductor device 3 and the VBG 5, and the first light is repeatedly reflected between these. While the reflection is repeated, the first light having passed the PPLN 7 is sequentially wavelength-converted into the second light, and taken out outside the device 90 from the VBG 5 or the reflection member 11.

That is, the laser device 90 is configured to select the first light having a first wavelength range selected by the VBG 5 from the basic light radiated from the light emitting part 2, and generate the second light that is wavelength-converted by the PPLN 7 and has a second wavelength range, from the first light, and output the second light outside as intended laser light. As one example, the first light can be infrared light having a peak wavelength of about 1065 nm, and the second light can be green visible light having a peak wavelength of about 532.5 nm.

PRIOR ART DOCUMENT

Patent Document

Patent document 1: JP-W-2003-526930
Patent document 2: JP-A-2012-098495
Patent document 3: JP-A-2014-187138

SUMMARY OF THE INVENTION

Problem to be Solved by the Invention

As described above, in the laser device 90, reflection of the first light is repeated between the semiconductor device 3 and the VBG 5. Therefore, in the laser device 90, it is preferred that the reflection plane of the semiconductor device 3 and the reflection plane of the VBG 5 are parallel with each other so that reflection of the first light is repeated efficiently between the semiconductor device 3 and the VBG 5. This is because inclination of the reflection plane of the VBG 5 with respect to the reflection plane of the semiconductor device 3 reduces the efficiency of reflection and leads to decrease in output of laser light.

Therefore, in the laser device 90, the factors that can make the reflection plane of the semiconductor device 3 and the reflection plane of the VBG 5 nonparallel should be removed as much as possible.

It is an object of the present invention to realize an external resonator type laser device capable of controlling decrease in output of the laser light by controlling occurrence of a factor that can make the reflection plane of a semiconductor device and the reflection plane of an optical element such as VBG nonparallel.

Means for Solving the Problem

An external resonator type laser device of the present invention includes:

an optical element that forms an external resonator with a semiconductor device by selecting and reflecting light of a specific wavelength range from light outputted from the semiconductor device;

a supporting member formed of a material having a larger coefficient of linear expansion than that of the optical element; and a first mount interposed between the optical element and the supporting member, formed of a material having a coefficient of linear expansion closer to that of the optical element compared with that of the supporting member, and the optical element is adhered to the first mount, and the first mount is adhered to the supporting member by an adhesive having a Shore hardness of less than or equal to 65.

According to the above external resonator type laser device, occurrence of a factor that makes the reflection plane of the semiconductor device and the reflection plane of the optical element nonparallel is prevented, and thus decrease in output of laser light can be controlled. The details will be described in the section of DETAILED DESCRIPTION OF THE PREFERRED EMBODIMENTS.

In the above configuration, the first mount may be adhered to the supporting member by a thermosetting adhesive, and the optical element may be adhered to the first mount by a photocurable adhesive.

According to the above configuration, even when the first mount is adhered to the supporting member by the thermosetting adhesive rather than by the photocurable adhesive, it becomes possible to position the optical element at a desired position. As a result, decrease in output of the external resonator type laser device can be controlled. The details will be described in the section of DETAILED DESCRIPTION OF THE PREFERRED EMBODIMENTS.

In the above configuration, the optical element includes:

a wavelength selection element that selects and reflects light of the specific wavelength range; and a second mount interposed between the wavelength selection element and the first mount, formed of a material having a coefficient of linear expansion closer to that of the first mount compared with that of the supporting member, and the second mount may be adhered to the first mount by a photocurable adhesive.

According to the above configuration, the wavelength selection element is adhered to the first mount by the photocurable adhesive via the second mount. As a result, it is possible to prevent breakage of the wavelength selection element and impairment in quality. The details will be described in the section of DETAILED DESCRIPTION OF THE PREFERRED EMBODIMENTS.

In the above configuration, difference between a coefficient of linear expansion of the supporting member and a coefficient of linear expansion of the first mount may range from $1.3 \times 10^{-6}$ (/K) to $22.63 \times 10^{-6}$ (/K).

Effect of the Invention

According to the external resonator type laser device of the present invention, it becomes possible to prevent occurrence of a factor that can make the reflection plane of the semiconductor device and the reflection plane of the optical element nonparallel, and as a result it is possible to control decrease in output of the laser light.

BRIEF DESCRIPTION OF THE DRAWINGS

FIG. 4 is a table showing test results;

DETAILED DESCRIPTION OF THE PREFERRED EMBODIMENTS

Figure 1:
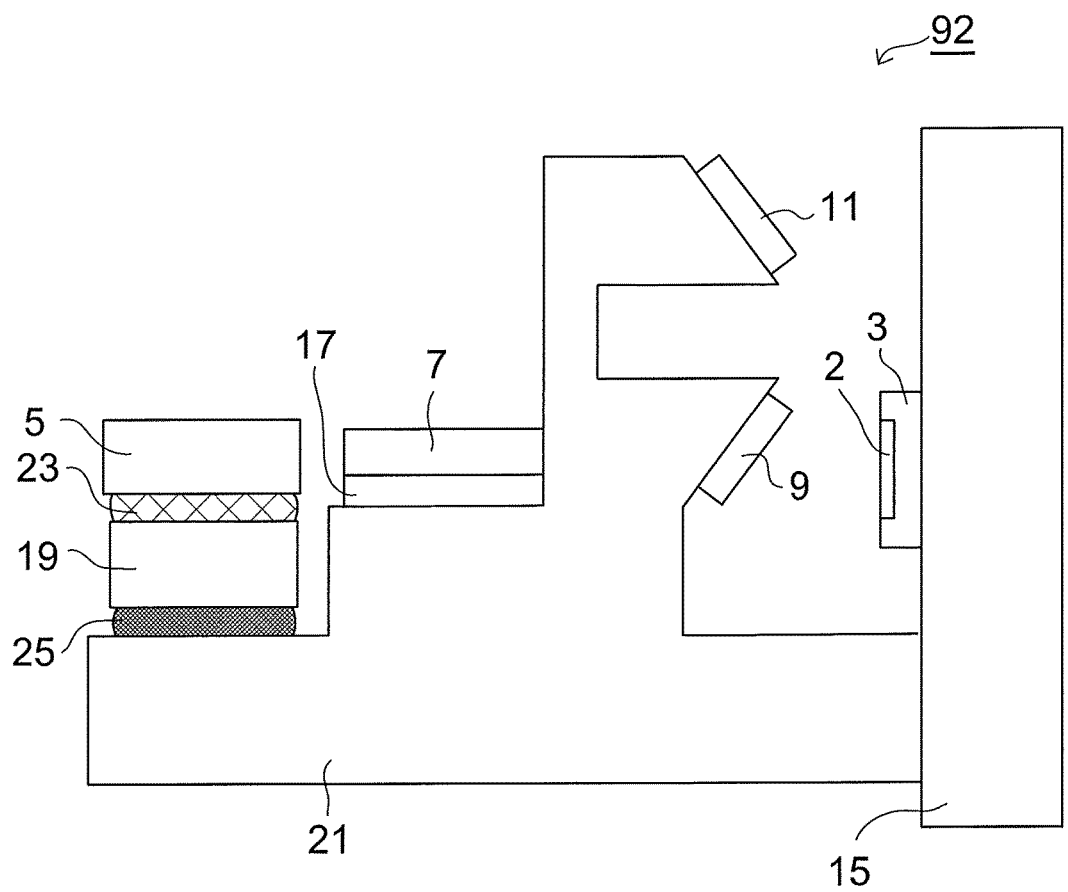
FIG. 1 is a view schematically showing a configuration of an external resonator type laser device of a reference example.

An external resonator type laser device of the present invention will be described by referring to drawings. In each drawing, the dimensional ratio in the drawing and the actual dimensional ratio do not necessarily coincide with each other.

Figure 9:
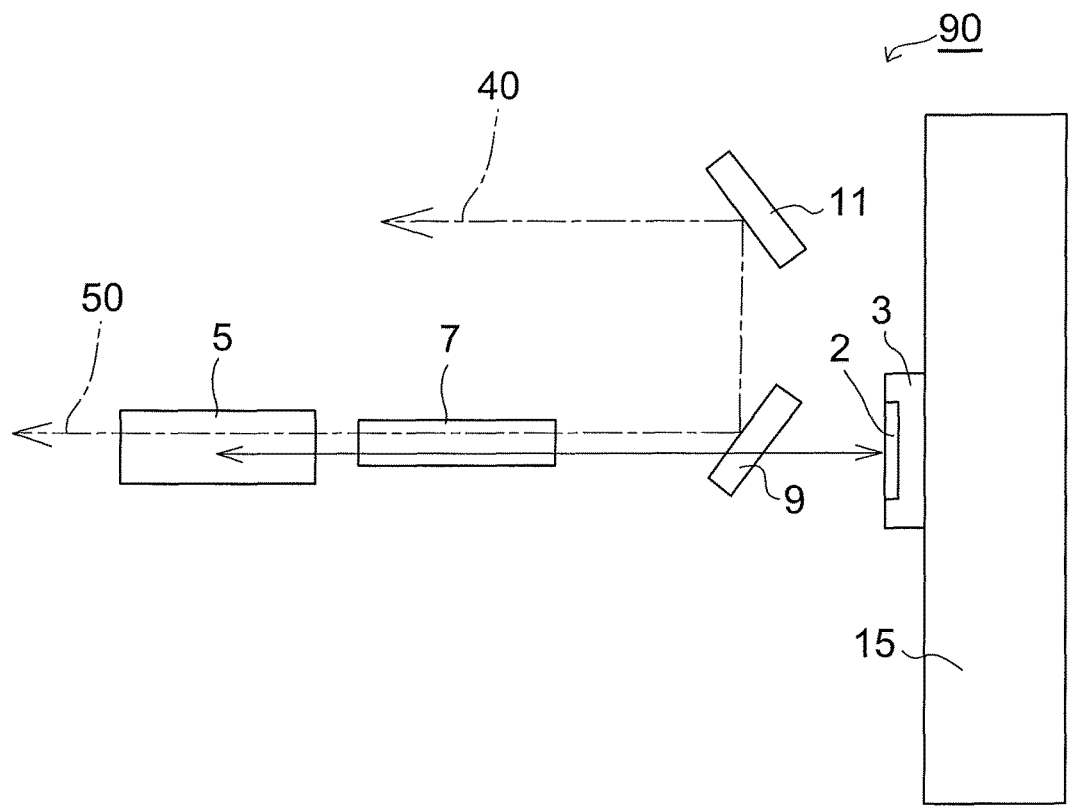
FIG. 9 is a view schematically showing a configuration of a conventional external resonator type laser device.

As described above with reference to FIG. 9, for example, an external resonator type laser device includes the semiconductor device 3 as a light source, and the VBG 5 as a wavelength selection element. As a result of diligent study regarding for the laser device having such a configuration, the present inventor confirmed that there is a case that the reflection plane of the semiconductor device 3 and the reflection plane of the VBG 5 become nonparallel with each other, and the output of the laser light decreases.

FIG. 1 is a view schematically showing a configuration in which the reflection plane of the semiconductor device 3 and the reflection plane of the VBG 5 become nonparallel, and the output of the laser light decreases as described above. Hereinafter, this configuration is referred to as a "reference example" for convenience. An external resonator type laser device 92 of the reference example shown in FIG. 1 is appropriately abbreviated as the "laser device 92".

REFERENCE EXAMPLE

[Configuration]

First, a configuration of the laser device 92 of the reference example will be described. The laser device 92 includes a semiconductor device 3 having a light emitting part 2, a VBG 5 as a wavelength selection element, a PPLN 7 as a wavelength conversion element, reflection members 9, 11, a heat sink 15, a heater 17, a mount 19, and a supporting member 21. Since the light emitting part 2, the semiconductor device 3, the VBG 5, the PPLN 7, the reflection members 9, 11 and the heat sink 15 are the same as those in the conventional external resonator type laser device 90, the description thereof will be omitted.

The heater 17 transmits heat to the PPLN 7 to control the temperature of the PPLN 7. The wavelength range that can be converted by the PPLN 7 changes depending on the temperature. By adjusting the temperature of the PPLN 7, the heater 17 controls the wavelength range that can be converted by the PPLN 7.

The mount 19 is a base that supports the VBG 5.

The supporting member 21 supports the reflection members 9, 11. The supporting member 21 supports the PPLN 7 via the heater 17, and supports the VBG 5 via the mount 19.

The VBG 5 and the mount 19 are adhered by a thermosetting adhesive 23. The mount 19 and the supporting member 21 are adhered by a photocurable adhesive 25.

The thermosetting adhesive such as epoxy resin, for example, is an adhesive that cures by heating. The photocurable adhesive such as a UV adhesive, for example, has both the property of curing by heating, and the property of curing by light irradiation. When the adhesive is cured by light irradiation, curing occurs in a shorter time than the case of curing by heating. Therefore, according to the photocurable adhesive, first, the objects to be adhered are temporarily fixed by light irradiation, and then heating is conducted to completely cure the adhesive including the part that is not cured by light irradiation (final fixation).

Hereinafter, the reason why the mount 19 and the supporting member 21 are adhered by the photocurable adhesive 25 rather than by the thermosetting adhesive 23 will be described by illustrating a method for producing the laser device 92.

[Production Method]

Figure 2A:
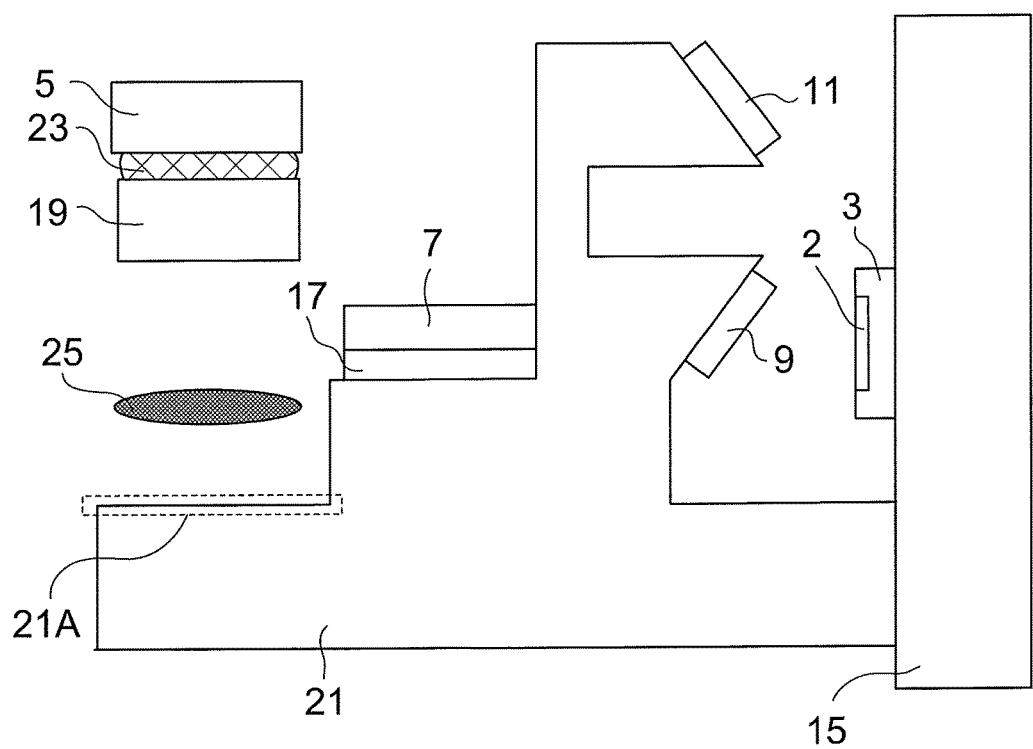
FIG. 2A is a view schematically showing part of the production process of the external resonator type laser device in the reference example.
Figure 2B:
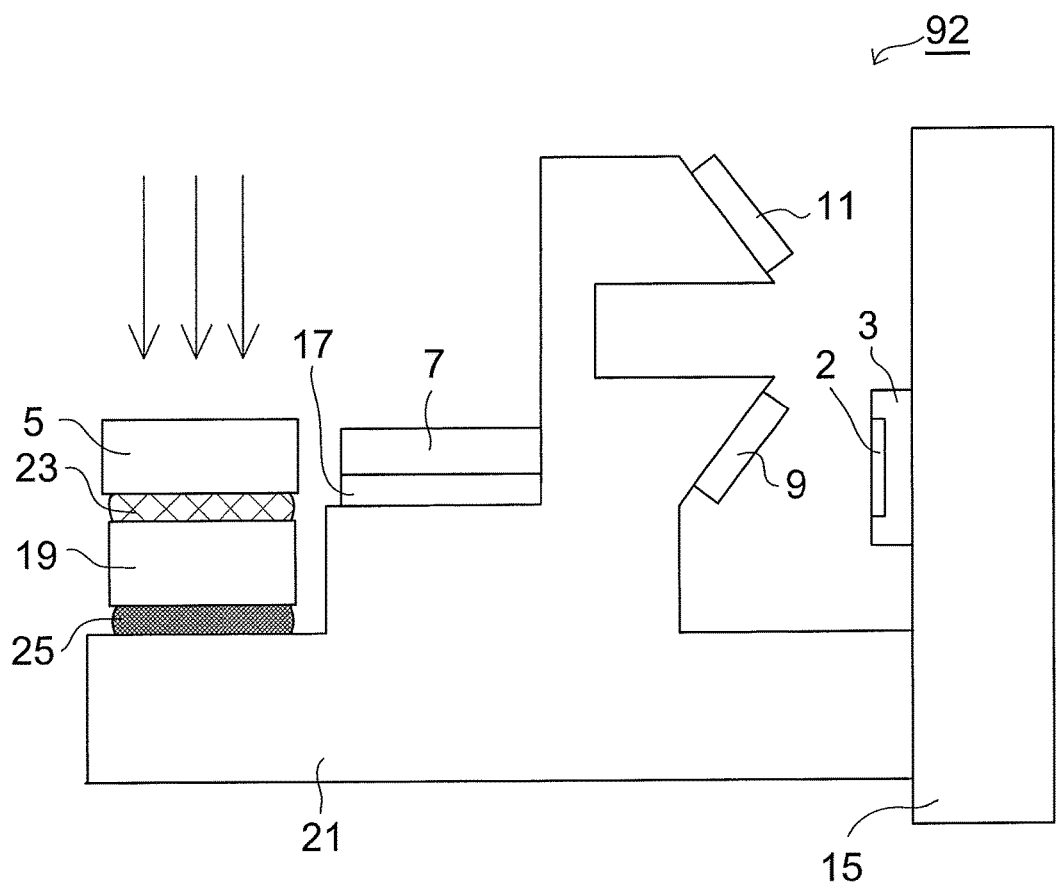
FIG. 2B is a view schematically showing part of the production process of the external resonator type laser device in the reference example.

FIG. 2A and FIG. 2B show a method for producing the laser device 92 of the reference example.

First, the VBG 5 and the mount 19 are adhered by the thermosetting adhesive 23 (illustration omitted). Subsequently, as shown in FIG. 2A, the photocurable adhesive 25 is applied on a placement face 21A of the supporting member 21, and the mount 19 to which the VBG 5 is adhered is placed on the photocurable adhesive 25. Then the position of the mount 19 is adjusted so that the reflection plane of the VBG 5 is parallel with the reflection plane of the semiconductor device 3.

Specifically, the mount 19 is fixed to a device that is not illustrated, and by adjusting the position of the mount 19 by the device, the position of the VBG 5 is adjusted. By adjusting the position of the VBG 5 via the mount 19 without directly touching the VBG 5, it is possible to prevent breakage of the VBG 5 and impairment of the quality.

After end of the positional adjustment of the VBG 5, the photocurable adhesive 25 residing between the mount 19 and the supporting member 21 is cured by light irradiation from above the VBG 5 and from laterally of the photocurable adhesive 25, as shown in FIG. 2B. The VBG 5 and the mount 19 are formed of a material that transmits light such as glass. The light irradiated on the upper face of the VBG 5 permeates the VBG 5 and the mount 19, and reaches the photocurable adhesive 25, and cures the adhesive 25. As a result, the mount 19 to which the VBG 5 is adhered is temporarily fixed on the supporting member 21.

After temporarily fixed on the supporting member 21 with the use of photocuring by the photocurable adhesive 25, the mount 19 is finally fixed on the supporting member 21 by thermosetting of the adhesive 25 by heating. That is, the mount 19 is positioned at the post-adjustment position by the temporary fixation which is the first step, and adhesion with the supporting member 21 is strengthened by the final fixation which is the second step. By adhering the mount 19 and the supporting member 21 by the photocurable adhesive 25 in the manner as described above, the VBG 5 adhered to the mount 19 is prevented from being fixed at a position deviated from the post-adjustment position.

[Discussion]

As a result of diligent study, the present inventor has found that a crack occurs in the photocurable adhesive 25 that adheres the mount 19 and the supporting member 21 in such an environment that the temperature of the laser device 92 largely changes. Also the present inventor has found that due to inclination of the mount 19 caused by the crack, the reflection plane of the VBG 5 becomes nonparallel with the reflection plane of the semiconductor device 3, and the output decreases. This phenomenon has been newly found by the diligent study by the present inventor.

Hereinafter, discussion of the present inventor regarding the reason of occurrence of a crack in the photocurable adhesive 25 in the laser device 92 of the reference example will be described.

In order to change the environmental temperature of the laser device 92 of the reference example, the present inventor made a test of shifting the laser device 92 placed in a normal temperature environment such as 25 to 30° C., to a low temperature environment such as −40° C., and then returning to the normal temperature environment. This simulates, for example, the case where the laser device 92 is transported by air. As a result, it was found that in the laser device 92, a crack occurred in the photocurable adhesive 25 adhering the mount 19 and the supporting member 21 as described above, and the output of the laser light decreased. In the laser device 92 that was kept placed in a normal temperature environment, a crack did not occur in the photocurable adhesive 25 adhering the mount 19 and the supporting member 21.

Based on the above examination, the present inventor concluded that a crack occurs in the photocurable adhesive 25 adhering the mount 19 and the supporting member 21 when the temperature environment of the laser device 92 changes significantly. And the present inventor inferred that this is caused by difference in expansion/contraction amount due to difference in coefficient of linear expansion between the mount 19 and the supporting member 21.

Here, the supporting member 21 is formed of metal, and the mount 19 is formed of glass, and the coefficients of linear expansion of these are different from each other. As one example, when the supporting member 21 is formed of stainless (for example, SUS304), the coefficient of linear expansion is $17.3 \times 10^{-6}$ (/K), and when the mount 19 is formed of borosilicate glass, the coefficient of linear expansion is $3 \times 10^{-6}$ (/K), and the difference in coefficient of linear expansion is as large as $14.3 \times 10^{-6}$ (/K).

When there is difference in coefficient of linear expansion between the supporting member 21 and the mount 19, difference also arises in contraction amount between the supporting member 21 and the mount 19. Specifically, since the coefficient of the linear expansion of the supporting member 21 is larger than the coefficient of linear expansion of the mount 19, the contraction amount of the supporting member 21 is larger than the contraction amount of the mount 19. Therefore, in the adhesive 25, the compressive stress acting on the lower part which is on the side of the supporting member 21 is larger than the compressive stress acting on the upper part which is on the side of the mount 19.

Accordingly, the photocurable adhesive 25 cannot absorb the large compressive stress acting on the lower part (on the side of the supporting member 21), and it is considered that this results in occurrence of a crack in the adhesive 25.

Based on the above discussion, the present inventor has considered that occurrence of a crack would be prevented if the adhesive adhering the mount 19 and the supporting member 21 were able to absorb the large compressive stress acting on the lower part (on the side of the supporting member 21), and finally accomplished the present invention. Hereinafter, one embodiment of the present invention will be described.

First Embodiment

[Configuration]

Figure 3:
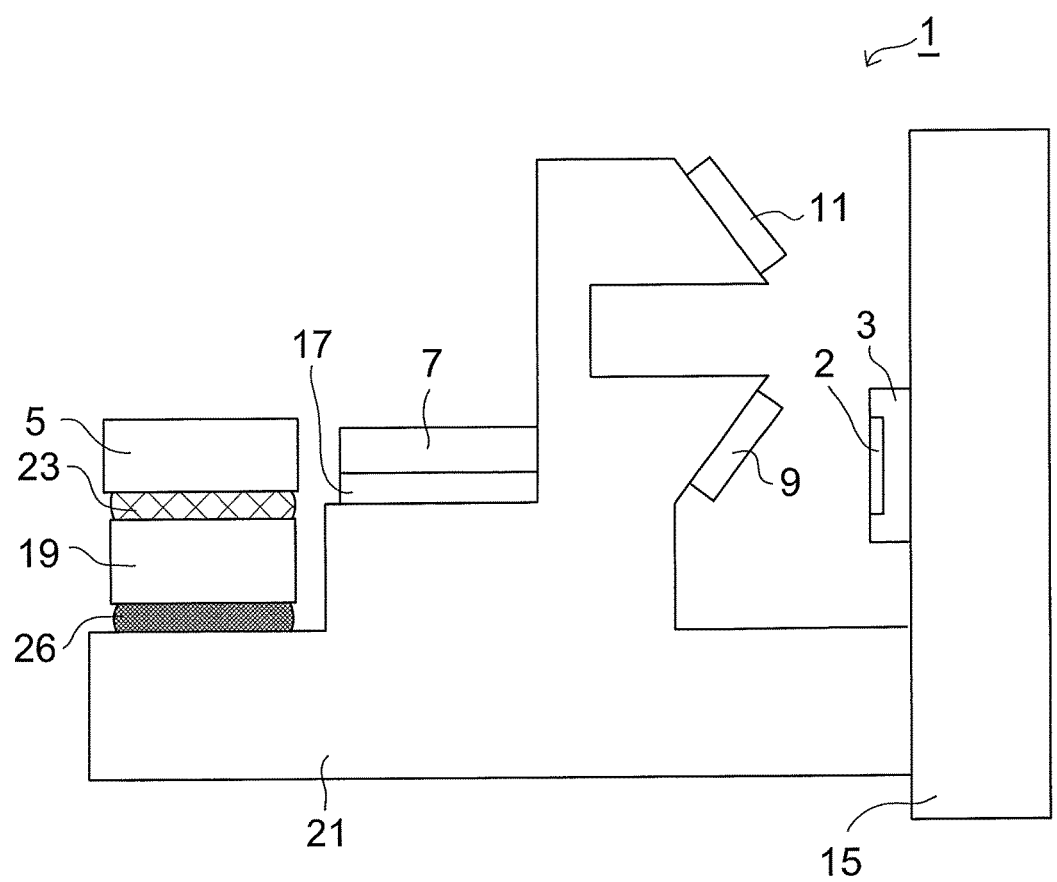
FIG. 3 is a view schematically showing a configuration of an external resonator type laser device in the first embodiment.

Referring to FIG. 3, a configuration of an external resonator type laser device 1 in the first embodiment will be described. In the following, the "external resonator type laser device 1" is abbreviated as a "laser device 1" as appropriate.

The external resonator type laser device 1 includes a semiconductor device 3 having a light emitting part 2, a VBG 5, a PPLN 7, reflection members 9, 11, a heat sink 15, a heater 17, a mount 19, and a supporting member 21. In the present embodiment, the VBG 5 corresponds to "optical element". The mount 19 corresponds to "first mount". Hereinafter, the description will be made focusing on the point different from that in the laser device 92 of the reference example.

The VBG 5 and the mount 19 are adhered by a thermosetting adhesive 23. The mount 19 and the supporting member 21 are adhered by a photocurable adhesive 26. The photocurable adhesive 26 is formed of a material having a different Shore hardness in comparison with the photocurable adhesive 25 used in the laser device 92 of the reference example. That is, the laser device 1 of the first embodiment is different from the laser device 92 of the reference example in that as an adhesive for adhering the mount 19 and the supporting member 21, the photocurable adhesive 26 is used in place of the photocurable adhesive 25.

Here, the Shore hardness of the photocurable adhesive 26 is lower than the Shore hardness of the photocurable adhesive 25. As one example, the Shore hardness of the photocurable adhesive 26 is 55, and the Shore hardness of the photocurable adhesive 25 is 90.

In the present specification, the Shore hardness indicates a Shore D hardness measured in conformity with JIS K7215.

[Test]

The present inventor made a test of shifting the laser device 1 in the normal temperature environment to the low temperature environment, and then returning to the normal temperature environment. No clack occurred in the photocurable adhesive 26, and no change in light output of the laser device 1 was observed.

The present inventor made the same test using various adhesives having smaller Shore hardness than the Shore hardness (90, in this embodiment) of the photocurable adhesive 25 used in the laser device 92 of the reference example shown in FIG. 1 in which a crack was observed. That is, tests were conducted to examine whether a crack occurred when the mount 19 and the supporting member 21 were adhered by the aforementioned various adhesives, and the relationship between the Shore hardness of the adhesive and occurrence of a crack was examined.

FIG. 4 shows the test results when nine kinds of adhesives A to I having a Shore hardness of less than or equal to 90 were used. A photocurable adhesive was used as the adhesive A, a photocurable adhesive was used as the adhesive B, a thermosetting adhesive was used as the adhesive C, a thermosetting adhesive was used as the adhesive D, a thermosetting adhesive was used as the adhesive E, a photocurable adhesive was used as the adhesive F, a thermosetting adhesive was used as the adhesive G, a thermosetting adhesive was used as the adhesive H, and a photocurable adhesive was used as the adhesive I.

As shown in FIG. 4, when the adhesives A to D (Shore hardness of 50, 55, 60, and 65) were used, no crack occurred in the adhesives. However, when the adhesives E to I (Shore hardness of 70, 75, 80, 85, and 90) were used, a crack occurred in the adhesives. That is, it was found that occurrence or nonoccurrence of a clack changes at the Shore hardness of 65 as a border.

These test results bring about the conclusion that occurrence of a crack in an adhesive can be prevented by using an adhesive having a Shore hardness of less than or equal to 65. That is, it can be stated that a crack occurring in an adhesive is caused by the hardness of the adhesive, and occurrence of a crack can be prevented by using an adhesive having relatively low hardness.

This is attributable to that according to the adhesive having a relatively low Shore hardness of less than or equal to 65, the adhesive easily deforms even when large compressive stress acts on the lower part (on the side of the supporting member 21) and can absorb the stress.

[Effect]

According to the laser device 1 of the first embodiment, no crack occurs in the photocurable adhesive 26 even when it is shifted from the normal temperature environment to the low temperature environment, and then returned to the normal temperature environment. Therefore, it is possible to prevent the reflection plane of the VBG 5 from becoming nonparallel with the reflection plane of semiconductor device 3, and to control decrease in output of the laser device 1. In other words, according to the laser device 1 of the first embodiment, it is possible to realize the laser device 1 having high reliability capable of enduring environmental change during transportation.

Second Embodiment

The present inventor examined hardness of the thermosetting adhesive 23 in the laser device 1 of the first embodiment, and found that the Shore hardness was 65. In light of this, the present inventor examined a laser device having such a configuration that the mount 19 and the supporting member 21 are adhered by the thermosetting adhesive 23.

Hereinafter, a configuration of an external resonator type laser device 31 of the second embodiment configured in this manner will be described by referring to FIG. 5. In the following, the "external resonator type laser device 31" is abbreviated as a "laser device 31" as appropriate.

[Configuration]

The external resonator type laser device 31 includes a semiconductor device 3 having a light emitting part 2, a VBG 5, a PPLN 7, reflection members 9, 11, a heat sink 15, a heater 17, a first mount 19a, a second mount 19b, and a supporting member 21. In the present embodiment, the VBG 5 corresponds to "wavelength selection element", and the configuration including the VBG 5 and the second mount 19b corresponds to "optical element". Hereinafter, the description will be made focusing on the point different from that in the laser device 1 of the first embodiment.

Figure 5:
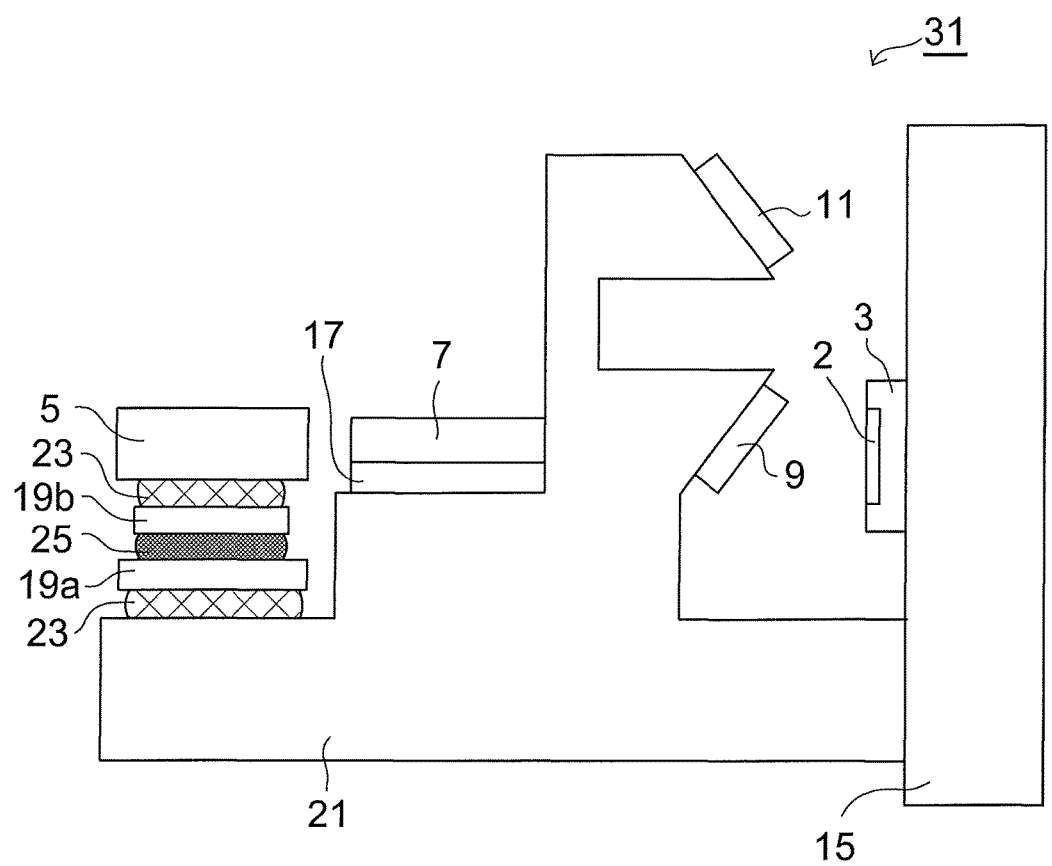
FIG. 5 is a view schematically showing a configuration of an external resonator type laser device in the second embodiment.

As shown in FIG. 5, in the laser device 31, the base that supports the VBG 5 is divided into two: the first mount 19a and the second mount 19b. The first mount 19a and the second mount 19b are formed of the same material, and have the same coefficient of linear expansion. In the present embodiment, the first mount 19a and the second mount 19b are formed of glass. As one example, the first mount 19a and the second mount 19b are formed of borosilicate glass.

The first mount 19a and the supporting member 21 are adhered by a thermosetting adhesive 23, the first mount 19a and the second mount 19b are adhered by a photocurable adhesive 25, and the VBG 5 and the second mount 19b are adhered by the thermosetting adhesive 23. As described above, the Shore hardness of the thermosetting adhesive 23 is 65. Also the Shore hardness of the photocurable adhesive 25 is 90 likewise the one used in the laser device 92 of the reference example shown in FIG. 1.

[Effect]

Likewise the first embodiment, when the laser device 31 is shifted from the normal temperature environment to the low temperature environment, and then returned to the normal temperature environment, large compressive stress acts on the lower part (on the side of the supporting member 21) of the photocurable adhesive 23. However, as described above, the Shore hardness of the adhesive 23 is 65 and is relatively low. Hence the photocurable adhesive 23 absorbs the stress by easily deforming even when large compressive stress acts on the lower part (on the side of the supporting member 21), and thus it is possible to prevent occurrence of a crack. In other words, also by the laser device 31 of the second embodiment, it is possible to realize the laser device 31 having high reliability capable of enduring environmental change during transportation.

The first mount 19a and the second mount 19b are formed of borosilicate glass, as one example, and both of these have the same coefficient of linear expansion. Therefore, even when large temperature change occurs in the laser device 31, significant difference does not arise in the contraction amount caused by the temperature change. Therefore, only a slight stress acts on the photocurable adhesive 25. Therefore, the possibility of occurrence of a crack in the photocurable adhesive 25 is low even when the first mount 19a and the second mount 19b are adhered by the photocurable adhesive 25 having a relatively high Shore hardness of 90.

Further, according to the laser device 31 of the second embodiment, it is possible to configure the laser device 31 by using the thermosetting adhesive 23 and the photocurable adhesive 25 that are conventionally used in the laser device 92 of the reference example. In other words, it is possible to use the adhesive 23 and the adhesive 25 having instances of actual use, and hence there is no need to newly conduct an examination in association with employment of an adhesive without instances of actual use.

[Production Method]

Figure 6A:
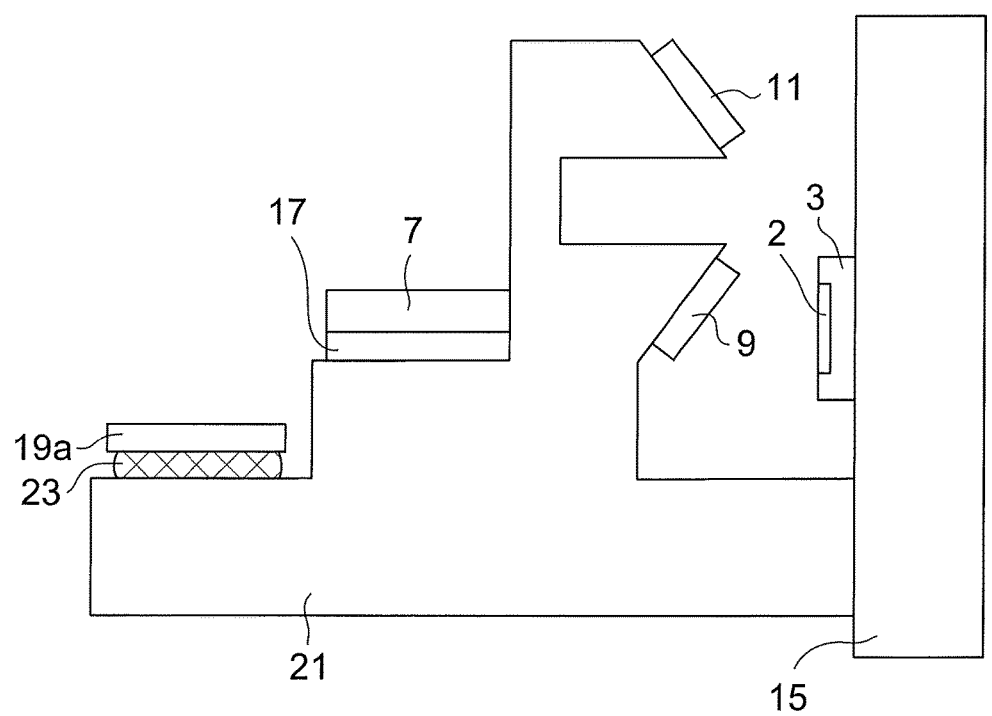
FIG. 6A is a view schematically showing part of the production process of the external resonator type laser device in the second embodiment.
Figure 6B:
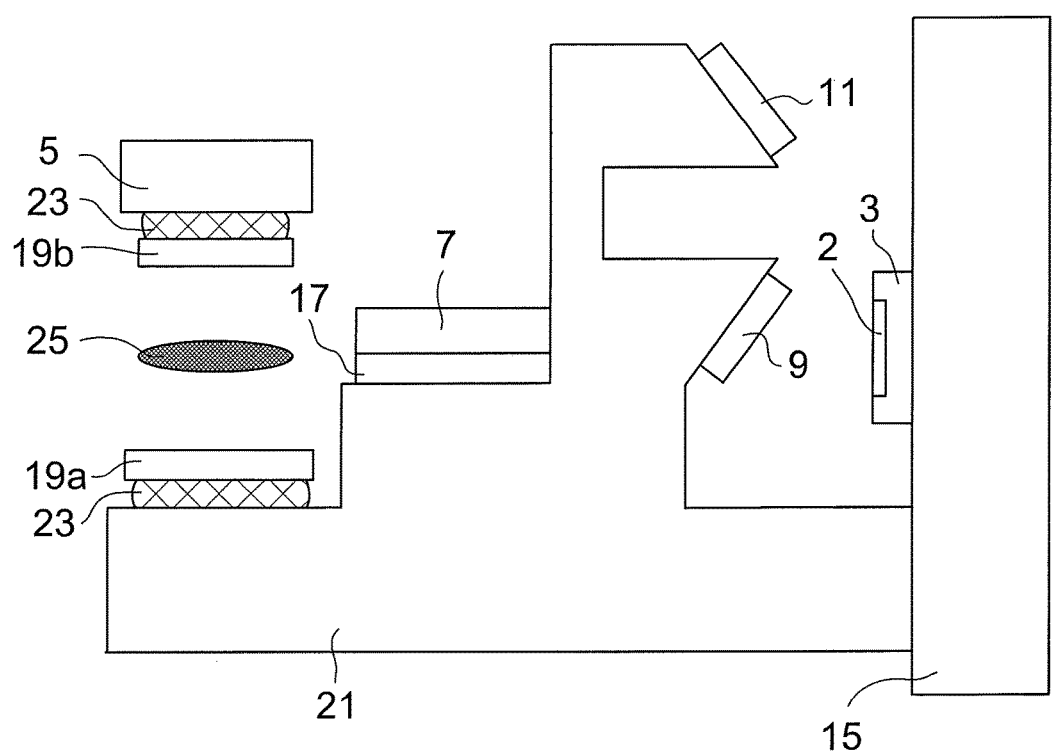
FIG. 6B is a view schematically showing part of the production process of the external resonator type laser device in the second embodiment.
Figure 6C:
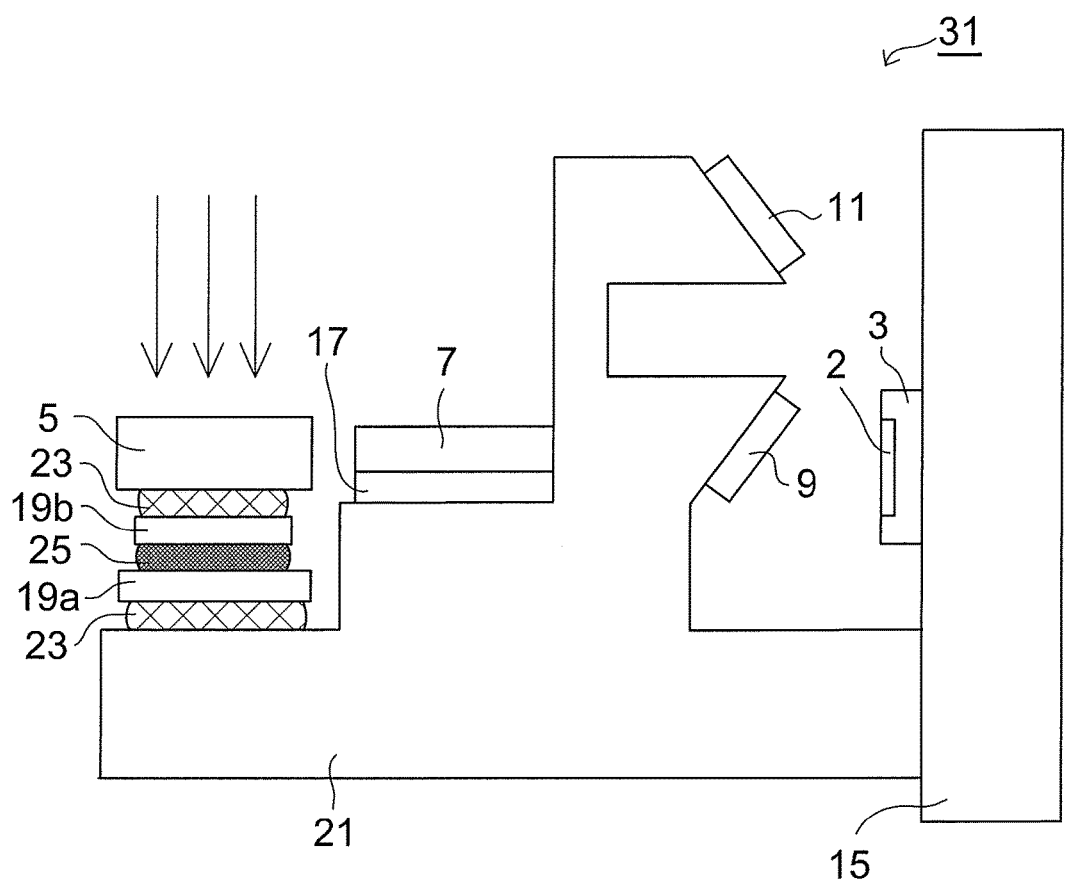
FIG. 6C is a view schematically showing part of the production process of the external resonator type laser device in the second embodiment.

Referring to FIG. 6A to FIG. 6C, first, a method for producing the laser device 31 will be described.

As shown in FIG. 6A, the first mount 19a is adhered on the supporting member 21 by the thermosetting adhesive 23. Then the VBG 5 and the second mount 19b are adhered by the thermosetting adhesive 23 (illustration omitted).

Then as shown in FIG. 6B, the photocurable adhesive 25 is applied on the upper face of the first mount 19a, and the second mount 19b to which the VBG 5 is adhered is placed on the photocurable adhesive 25. Then positional adjustment is conducted so that the reflection plane of the VBG 5 is parallel with the reflection plane of the semiconductor device 3.

After end of the positional adjustment, light is irradiated from above the VBG 5 as shown in FIG. 6C to cure the photocurable adhesive 25. As a result, the second mount 19b to which the VBG 5 is adhered is temporarily fixed on the first mount 19a. Thereafter, by heating the laser device 31, the photocurable adhesive 25 is completely cured.

In the manner as described above, the second mount 19b to which the VBG 5 is adhered is adhered on the first mount 19a by the photocurable adhesive 25. As a result, it is possible to prevent the VBG 5 from being fixed at the position deviated from the post-adjustment position, and to control decrease in output of the laser device 31. Further, the positional adjustment of the VBG 5 is conducted via the second mount 19b. That is, since the positional adjustment of the VBG 5 is conducted without a direct touch, it is possible to prevent breakage of the VBG 5 and impairment in quality.

In the present embodiment, the case where an adhesive having a Shore hardness of 65 is used as the thermosetting adhesive 23 is described. However, in consideration of the description in the first embodiment, it is possible to prevent occurrence of a crack by using an adhesive having a Shore hardness of less than or equal to 65 as the thermosetting adhesive 23 also in the present embodiment.

Another Embodiment

Figure 7:
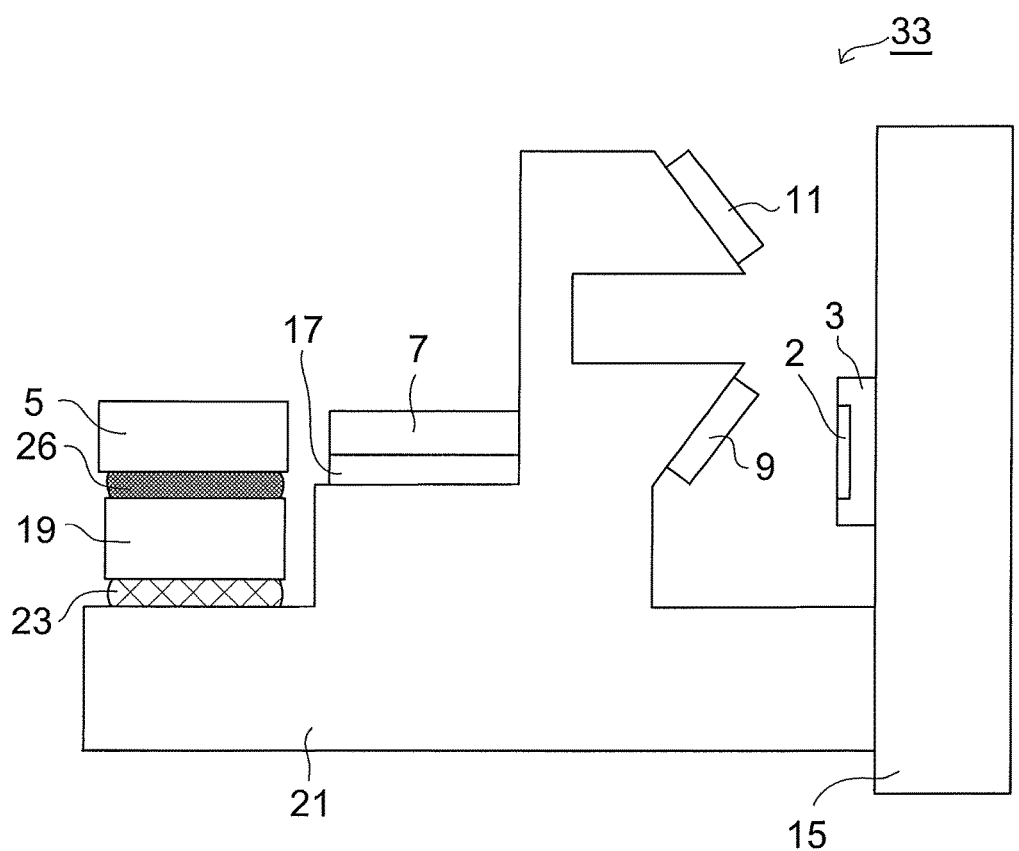
FIG. 7 is a view schematically showing a configuration of an external resonator type laser device in another embodiment.

<1> In the laser device 1, the mount 19 and the supporting member 21 were adhered by the photocurable adhesive 26, and the VBG 5 and the mount 19 were adhered by the thermosetting adhesive 23. In contrast to this, it is also possible to adhere the mount 19 and the supporting member 21 by the thermosetting adhesive 23 having a Shore hardness of less than or equal to 65, and to adhere the VBG 5 and the mount 19 by the photocurable adhesive 26, as in a laser device 33 of another embodiment shown in FIG. 7. In this case, the VBG 5 corresponds to "optical element" and the mount 19 corresponds to "first mount".

Hereinafter, referring to FIG. 8A to FIG. 8C, the outline of a method for producing the laser device 33 will be described.

Figure 8A:
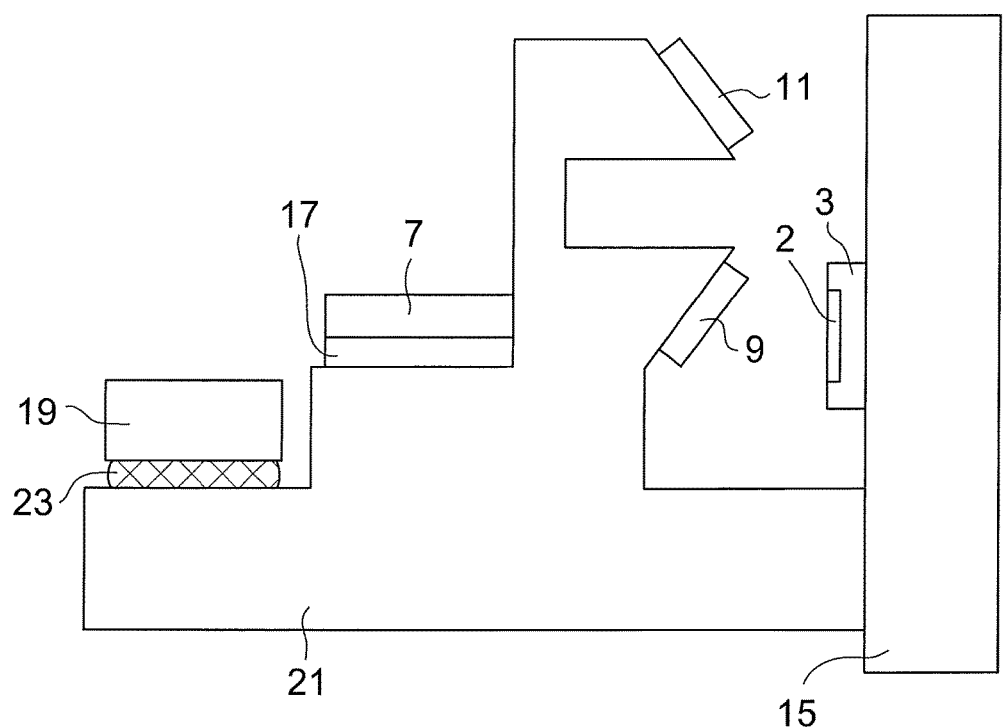
FIG. 8A is a view schematically showing part of the production process of the external resonator type laser device in another embodiment.

As shown in FIG. 8A, the mount 19 is adhered on the supporting member 21 by the thermosetting adhesive 23.

Figure 8B:
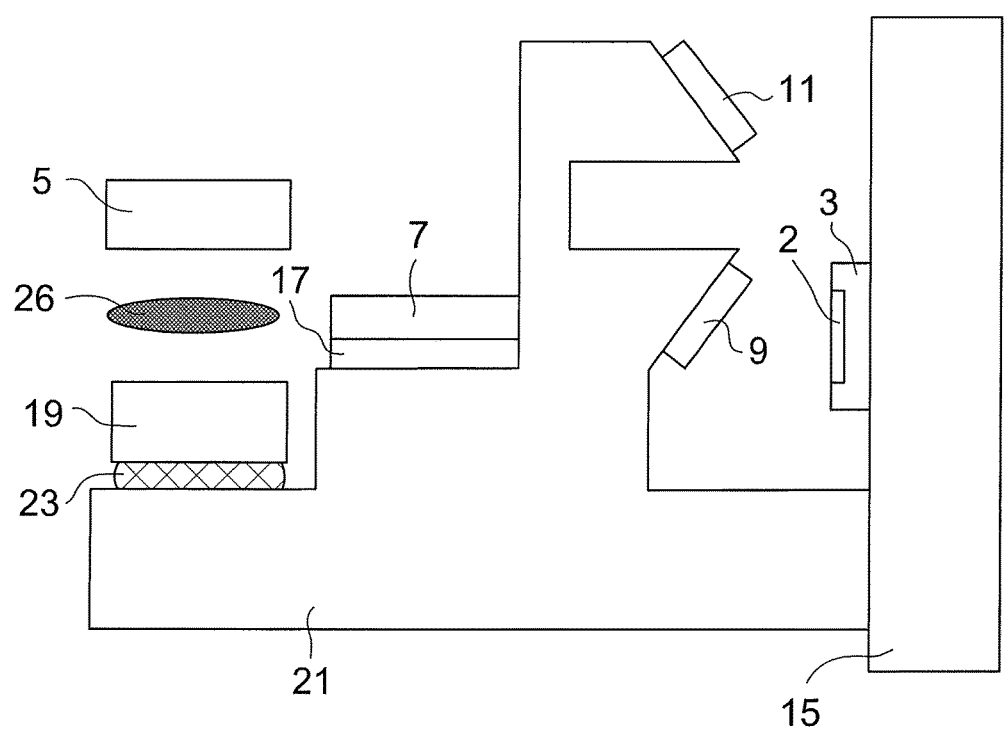
FIG. 8B is a view schematically showing part of the production process of the external resonator type laser device in another embodiment.
Figure 8C:
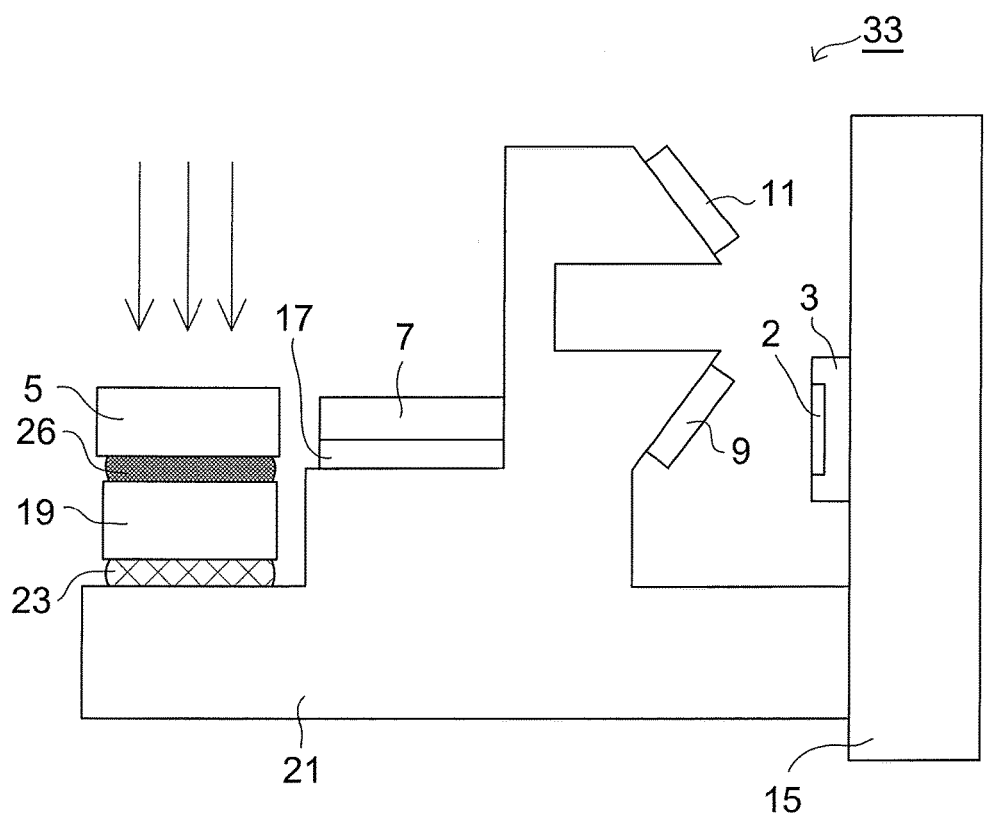
FIG. 8C is a view schematically showing part of the production process of the external resonator type laser device in another embodiment.

Then as shown in FIG. 8B and FIG. 8C, the VBG 5 is adhered on the mount 19 by the photocurable adhesive 26. Before curing the photocurable adhesive 26 by light irradiation, positional adjustment of the VBG 5 is conducted. Specifically, the VBG 5 is fixed to a not-illustrated device, and positional adjustment of the VBG 5 is conducted by the device. The production method is different from the production method of the laser device 1 in the first embodiment in that the positional adjustment is conducted while the VBG 5 is directly touched in this manner.

Also in the laser device 33, likewise the laser device 1, the mount 19 and the supporting member 21 are adhered by the thermosetting adhesive 23 having a relatively low Shore hardness of 65. As a result, the thermosetting adhesive 23 is able to absorb the large compressive stress acting on the lower part (on the side of the supporting member 21), and to prevent occurrence of a crack in the adhesive 23.

In the case of the laser device 33, positional adjustment of the VBG 5 is conducted while the VBG 5 is directly touched. Accordingly, the VBG 5 can be broken in some cases. Occurrence of breakage in the VBG 5 is not desired because it influences on the reflection characteristics. Therefore, it is preferred to adjust the position while the VBG 5 is touched, for example, in the region far from the optical axis. As a result, significant influence is not exerted on the light reflection characteristics in case of occurrence of breakage in the VBG 5.

In the case of the laser device 1, since it is possible to conduct the positional adjustment of the VBG 5 while touching the mount 19 rather than the VBG 5, the laser device 1 is desired in the point that the handling of the member at the time of adjusting the position is facilitated in comparison with the laser device 33.

<2> In the laser device 31 of the second embodiment, description was made for the case where the first mount 19a and the second mount 19b are formed of borosilicate glass, and have the same coefficient of linear expansion. In contrast to this, the first mount 19a and the second mount 19b may be formed of different materials, and may have different coefficients of linear expansion. More specifically, it is only requested to satisfy the requirement that the second mount 19b is formed of a material having a coefficient of linear expansion closer to the coefficient of linear expansion of the first mount 19a compared with that of the supporting member 21.

<3> In the above embodiment, while the description was made such that the supporting member 21 is formed of stainless (for example, SUS304) as an example, it may be formed of aluminum (coefficient of linear expansion: $23.1 \times 10^{-6}$ (/K)), iron (coefficient of linear expansion: $11.8 \times 10^{-6}$ (/K)), tungsten (coefficient of linear expansion: $4.3 \times 10^{-6}$ (/K)), or copper (coefficient of linear expansion: $16.5 \times 10^{-6}$ (/K)) as other example. Also while the description was made such that the mount 19 is formed of borosilicate glass as one example, it may be formed of quartz glass (coefficient of linear expansion: $0.47 \times 10^{-6}$ (/K) to $0.64 \times 10^{-6}$ (/K)) as other example. Regardless of the used material, the coefficient of linear expansion of the supporting member 21 is largely different from the coefficient of the linear expansion of the mount 19, and the same problem as in the laser device 92 of the reference example can arise. It was confirmed that regardless of the material of which the supporting member 21 and the mount 19 are formed, occurrence of a crack in the adhesive can be prevented by adhering the supporting member 21 and the mount 19 by using the adhesive having a relatively low Shore hardness of less than or equal to 65.

In the above example, the difference between the coefficient of the linear expansion of supporting member 21 and the coefficient of the linear expansion of mount 19 ranges from $1.3 \times 10^{-6}$ (/K) to $22.63 \times 10^{-6}$ (/K). More specifically, when the supporting member 21 is formed of tungsten and the mount 19 is formed of borosilicate glass, the difference in coefficient of linear expansion between these is $1.3 \times 10^{-6}$ (/K) which is minimum. When the supporting member 21 is formed of aluminum, and the mount 19 is formed of quartz glass having a coefficient of linear expansion of $0.47 \times 10^{-6}$ (/K), difference in coefficient of linear expansion between these is $22.63 \times 10^{-6}$ (/K) which is maximum.

<4> In the laser device 1 of the first embodiment, the VBG 5 and the mount 19 are adhered by the thermosetting adhesive 23 having a Shore hardness of 65. Similarly, in the laser device 31 of the second embodiment, the VBG 5 and the second mount 19b are adhered by the thermosetting adhesive 23 having a Shore hardness of 65. However, since the difference in coefficient of linear expansion between the VBG 5 and the mount 19 (the second mount 19b) is small, the adhesive adhering the VBG 5 and the mount 19 (or the second mount 19b) may be naturally an adhesive having a Shore hardness of smaller than 65, and may be an adhesive having a Shore hardness of larger than 65. That is, the Shore hardness of the adhesive is irrelevant. Also, the adhesive may be thermosetting type or photocurable type.

<5> The photocurable adhesives 25, 26 are adhesives having both the property of curing by heating, and the property of curing by light irradiation. On the other hand, as the photocurable adhesive, an adhesive not having the property of curing by heating but having only the property of curing by light irradiation may be used. In this case, in the production method of the laser device (1, 31, 33), the final fixation by heating the photocurable adhesive is omitted.

<6> As one example of the wavelength selection element, the VBG 5 is recited. In place of the VBG 5, a TFF (dielectric thin film filter) and an optical member may be used. More generally, any one having a function of selecting and reflecting a specific wavelength range can be used.

<7> The laser device (1, 31, 33) may not have the reflection members 9, 11. That is, it may be configured to output the laser light outside the device only from the VBG 5.

What is claimed is:
1. An external resonator type laser device comprising:
   an optical element that forms an external resonator with a semiconductor device by selecting and reflecting light of a specific wavelength range from light outputted from the semiconductor device;
   a supporting member formed of a material having a larger coefficient of linear expansion than that of the optical element; and
   a first mount interposed between the optical element and the supporting member, formed of a material having a coefficient of linear expansion closer to that of the optical element compared with that of the supporting member, wherein the optical element is adhered to the first mount, and the first mount is adhered to the supporting member by an adhesive having a Shore hardness of less than or equal to 65.

2. The external resonator type laser device according to claim 1, wherein the first mount is adhered to the supporting member by a thermosetting adhesive, and the optical element is adhered to the first mount by a photocurable adhesive.

3. The external resonator type laser device according to claim 2, wherein the optical element includes:

a wavelength selection element that selects and reflects light of the specific wavelength range; and a second mount interposed between the wavelength selection element and the first mount, formed of a material having a coefficient of linear expansion closer to that of the first mount compared with that of the supporting member, wherein the second mount is adhered to the first mount by the photocurable adhesive.

4. The external resonator type laser device according to claim 1, wherein difference between a coefficient of linear expansion of the supporting member and a coefficient of linear expansion of the first mount ranges from $1.3 \times 10^{-6}$ (/K) to $22.63 \times 10^{-6}$ (/K).

* * * * *